United States Patent [19]

Kutsevalov et al.

[11] 3,980,950
[45] Sept. 14, 1976

[54] METHOD OF DETERMINING THE DISPLACEMENT ANGLE OF AN ELECTRIC MOTOR AND MEANS FOR EFFECTING SAME

[76] Inventors: Vitaly Mikhailovich Kutsevalov, ulitsa Ierikju, 43, kv. 28, Riga; Valery Konstantinovich Kanter, p/o Adazhi, dom "Vizmas", Rizhsky raion; Georgy Sazonovich Kornilov, ulitsa Riekstu, 16, kv. 102; Vitaly Ivanovich Ozols, ulitsa Maskavas, 250/10, kv. 89, both of Riga; Vladimir Ivanovich Frolov, ulitsa Oktyabrskaya, 49, kv. 25, Leningrad, Kolpino; Alexandr Timofeevich Glushkov, ulitsa Oktyabrskaya, 13, kv. 6, Leningrad, Kolpino; Igor Vitalievich Leontiev, ulitsa Pavlovskaya, 84, kv. 114, Leningrad Kolpino; Vladislav Alexandrovich Elizarov, ulitsa Vokzalnaya 23, kv. 47, Leningrad,Pushkino; Jury Petrovich Bobylev, prospekt Lenina, 40, kv. 43, Leningrad, Kolpino; Viktor Georgievich Mednitsky, prospekt Lenina, 9/15, kv. 15, Leningrad, Kolpino; Viktor Vasilievich Bushuev, ulitsa Tverskaya, 1/13, kv. 11, Leningrad, Kolpino, all of U.S.S.R.

[22] Filed: Nov. 26, 1974

[21] Appl. No.: 527,262

[30] Foreign Application Priority Data
Dec. 3, 1973 U.S.S.R. ............................ 1976379
Feb. 4, 1974 U.S.S.R. ............................ 1999301

[52] U.S. Cl. .......................... 324/158 MG; 318/490
[51] Int. Cl.$^2$ ........................................ G01R 31/00
[58] Field of Search .............. 324/158 MG; 318/490

[56] References Cited
FOREIGN PATENTS OR APPLICATIONS
178,410   2/1966   U.S.S.R. ...................... 324/158 MG Primary Examiner—R. V. Rolinec
Assistant Examiner—Ernest F. Karlsen
Attorney, Agent, or Firm—Holman & Stern

[57] ABSTRACT

The method of the present invention consists in passing a pulsating current through two series-connected working phase windings of the stator of an electric motor and determining the relationship between the displacement angle and phase voltages and line voltages across said windings.

This relationship is then used for determining the displacement angle of the electric motor which in this case is a synchronous reluctance motor operating in braking duty under conditions where there is no access to the motor shaft. Normally, this is the case with motors employed as an actuating means in the control and protection systems of nuclear reactors.

The device for carrying out the above method comprises a voltage comparison unit and an indicating instrument.

5 Claims, 7 Drawing Figures

METHOD OF DETERMINING THE DISPLACEMENT ANGLE OF AN ELECTRIC MOTOR AND MEANS FOR EFFECTING SAME

FIELD OF THE INVENTION

The present invention relates to methods and means for determining parameters and operating characteristics of electric machines, and more particularly to a method of determining the displacement or load angle of a synchronous reluctance motor operating in braking duty and predominantly serving as an actuating motor in the rack-and-gear drive of a nuclear power reactor control and protection system.

The invention also relates to a device for carrying out the above method of determining the displacement angle. The device of the present invention can be advantageously used in all cases where for some reason there is no access to the shaft of the motor being checked.

Such a situation normally occurs in the case of synchronous reluctance motors being employed as part of the equipment of a nuclear reactor.

BACKGROUND OF THE INVENTION

In the present state of the art, the displacement angle of synchronous reluctance motors operating in braking duty is measured by an angle meter comprising a pointer associated with the shaft of the motor under investigation and a dial graduated in geometrical or electrical degrees.

Such a method of determining the displacement angle, however, can only be applied when there is free access to the motor shaft.

Having measured the displacement angle, one can determine, in turn, the static torque at the motor shaft and, consequently, maintain the drive, particularly, the rack-and-gear drive of a nuclear reactor, in working condition. In the course of operation of a nuclear reactor, one should constantly check the presence of a charge container on the rack of the drive, as well as determine the margin of the positive load attributed to the weight of the charge container to the so-called "emersion" point. At present, to check the actual condition of this drive necessitates shut-down and decompression of the reactor, which affects the continuity of the nuclear power plant operation and involves carrying out extremely hazardous and difficult operations in the hot area of the reactor.

OBJECTS OF THE INVENTION

It is an object of the present invention to provide a method of determining the displacement angle of a synchronous reluctance motor operating in braking duty and serving, predominantly, as an actuating motor in the rack-and-gear drive of nuclear reactor control and protection systems, enabling determination of the displacement angle of synchronous reluctance motors in the channels of nuclear reactor control and protections systems, wherein there is no access to the motor shaft for attaching thereto an angle meter or special transmitters which are normally used to measure the static torque the motor shaft.

Another object of the invention is to provide a method of determining the displacement angle of a synchronous reluctance motor operating in braking duty and serving, predominantly, as an actuating motor in the rack-and-gear drive of nuclear reactor control and protection systems, enabling the procedure for determining the displacement angle to be simplified and the accuracy of its measurement to be enhanced.

Still another object of the invention is to provide a method of determining the displacement angle of a synchronous reluctance motor operating in braking duty and serving, predominantly, as an actuating motor in the rack-and-gear drive of nuclear reactor control and protection systems, which will improve the nuclear power plant personnel safety by ruling out the necessity to work in the hot area.

Yet another object of the invention is to provide a means for determining the displacement angle of a synchronous reluctance motor operating in braking duty, energized with an alternating pulsating current flowing through two series-connected working phase windings of its stator and serving, predominantly, as an actuating motor in the rack-and-gear drive of nuclear reactor control and protection systems, which will be simple and reliable in operation, i.e. free of special rotor position sensors, sliding contacts and other unreliable structural elements.

SUMMARY OF THE INVENTION

With these and other objects in view, in accordance with the present invention, a method is disclosed for determining the displacement angle of a synchronous reluctance motor operating in braking duty. The motor includes a three-phase star-connected stator winding arrangement with two series-connected working phase windings and a free third phase winding. The motor is generally used as an actuating motor in the drives of nuclear power reactor control and protection systems. When the motor shaft is accessible, the initial step of the method comprises passing a pulsating current of a predetermined magnitude through the stator windings and determining the relationship between the displacement angle and phase voltages and line voltages across the stator windings. Then during the operation of the motor when there is no access to the motor shaft, the method further comprises the step of measuring the phase and line voltages across the stator windings, while maintaining the magnitude of the current through the working phase windings at the predetermined value, whereby and the required angle is determined from said relationship.

This method permits the determination of the displacement angle of synchronous reluctance motors operating in braking duty in cases where there is no access to the motor shaft. One example is the actuating motor in the rack-and-gear drive of a nuclear power reactor control and protection system.

Having measured the displacement angle, one can determine, in turn, the static torque at the motor shaft, which is indicative of the condition of the rack-and-gear drive as a whole.

Moreover, the proposed method permits the substantial simplification of the procedure for determining the displacement angle and enhancing the accuracy of its determination. In addition, the safety of the personnel employed at the nuclear power plant is improved.

In accordance with an embodiment of the present invention, the proposed method consists of measuring two line voltages between the free phase winding and each working phase winding, while the displacement angle is determined from the relationship established between this angle and the line voltages.

This feature enables determination of the displacement angle of synchronous reluctance motors operating in braking duty under conditions where there is no access to the motor shaft, from the line voltages measured between the free phase winding and each working phase winding of the motor stator.

According to an alternative embodiment, the proposed method consists in measuring the phase voltages across the working phase windings in the case where the neutral terminal of the stator winding arrangement is brought out of the motor. The displacement angle is determined from the relationship established between this angle and said phase voltages.

This feature permits determination of the displacement angle of synchronous reluctance motors operating in braking duty under conditions where there is no access to the motor shaft, from the measured phase voltages across the working phase windings of the motor stator.

Another aspect of the present invention is a device for determining the displacement angle of a synchronous reluctance motor operating in braking duty with two series-connected working phase windings being energized from a source of pulsating current, in which device, according to the invention, the working shaft of the motor is inaccessible. The input of a voltage comparison unit is directly connected to the working phase windings while the free phase winding has the input of the voltage comparison unit connected thereto via a measurement range changer. The output of the voltage comparison unit is coupled, via a protection unit, to an indicating instrument graduated in the units of the displacement angle and load on the motor shaft.

Another feature of the proposed device is its use with a motor having the neutral terminal of its stator winding brought out therefrom. The neutral terminal is connected via the measurement range changer to the voltage comparison unit.

These novel features of the proposed device enable determination of the static torque at the motor shaft as well as constant checking of the rack-and-gear drive.

Being originally aimed at determining the displacement angle of electric motors, the herein disclosed method and means can as successfully be used for quality control in the manufacture of electric machine rotors, for example, for checking the quality of damper windings of synchronous machines and squirrel-cage windings of asynchronous machines. This particular application of the proposed device may substantially simplify and accelerate the control procedure. In the description that follows, some explanation is given as to how this is achieved.

DESCRIPTION OF THE DRAWINGS

The invention will now be described in greater detail with reference to a preferred embodiment thereof, taken in conjunction with the accompanying drawings, wherein:

FIG. 3 is a graphic representation of the relationship $U_{13} = f(\Delta)$; $U_{23} = f(\Delta)$ (rated $I_d = 10$ A) $U_3 = f(\Delta)$ of a synchronous reaction motor operating in braking duty;

DISCUSSION OF THE PREFERRED EMBODIMENT

Figure 1:
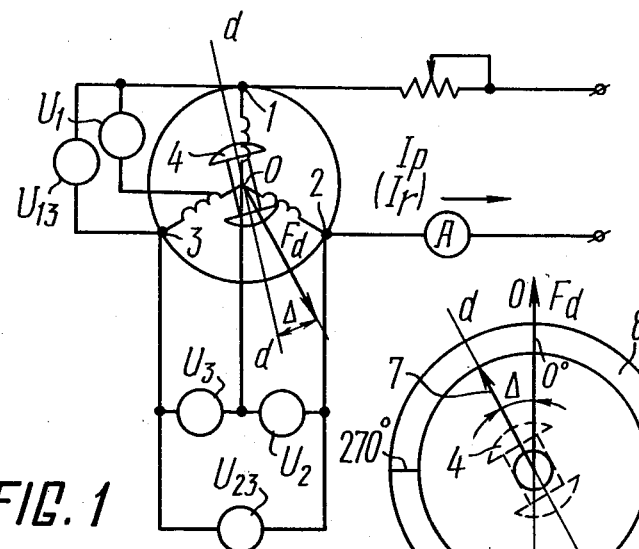
FIG. 1 is a diagram of power supply to a synchronous reluctance motor operating in braking duty.

Referring now to the drawings, FIG. 1 shows stator windings 1 and 2 and a free phase winding 3 of a synchronous reluctance motor operating in braking duty. A pulsating current $I_p$ or a rectified current $I_r$ having both a direct component $I_d$ and an alternating component $I_a$ is passed through windings 1 and 2.

The magnetomotive force direct component $F_d = I_d$ generates a magnetic flux direct component.

The magnetic flux interacts with the current $U_d$ to retain a rotor 4 of the motor in a definite position. If the motor shaft is acted upon by a static load moment $M_s$, the rotor 4 is made to rotate through a certain displacement angle $\Delta$ shown in FIG. 1, so that an electromagnetic moment $M_e$ is developed by the motor at this instant which counter-balances the applied static load moment $M_s$, i.e. $M_s = M_e$.

Those skilled in the art know the relationship $$M_e = I_d^2 \sin d\, 2\Delta$$

from the theory of synchronous reluctance motors operating with a preset magnitude of the current $I_d$ in the stator winding.

Thus, with the known basic parameters of a synchronous reluctance motor and a given current magnitude, the electromagnetic moment $M_e$ is proportional to the sine of a double displacement angle $\Delta$, therefore, having measured the angle one can determine the moment $M_e$.

Figure 2:
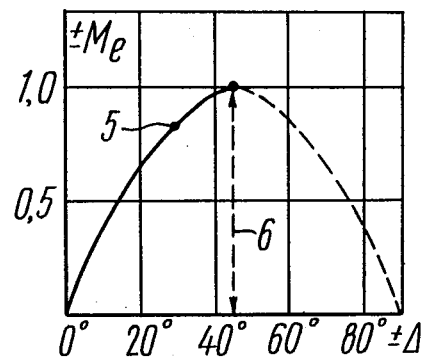
FIG. 2 is the load-angle characteristic curve of a synchronous reaction motor operating in braking duty.

Shown in FIG. 2 are a load-angle curve 5 of a synchronous reluctance motor operating in braking duty, as well as the steady-state stability limit 6 of its operation.

At the same time, the alternative current component induces voltage drops $U_1$ and $U_2$ shown in FIG. 1, across the stator phase windings 1 and 2 and an electromotive force $E_3$ in the free phase winding 3 of FIG. 1.

The phase voltages $U_1$, $U_2$, $U_3 = E_3$ depend, with given values of the direct component $I_d$ and alternating component $I_a$, on the position of a longitudinal axis d—d of the rotor 4 relative to the direction of the axis of the magnetomotive force $F_d$, i.e. $U_1 = f(\Delta)$, $U_2 = f(\Delta)$ and $U_3 = f(\Delta)$. Line voltages $U_{13}$ and $U_{23}$ of FIG. 1 also depend on the angle $\Delta$.

FIG. 3 shows, by way of example, curves $U_{13}$, $U_{23}$, $U_3$ and $-U_3$ indicative of the relationships between respective voltages and the displacement angle $\Delta$ of a particular synchronous reluctance motor having a rated torque of 60 Nm, with rated $I_d = 10$ A and, for comparison, $I_d = 15$ A.

The relationships $U_1 = f(\Delta)$, $U_2 = f(\Delta)$, $U_3 = f(\Delta)$, $U_{13} = f(\Delta)$ and $U_{23} = f(\Delta)$ can be used for determining the angle $\Delta$. It is more convenient, however, to use the relationship $(U_{13} - U_{23}) = f(\Delta)$ for determining the angle $\Delta$ since in the case of $\Delta = 0°$, $(U_{13} - U_{23}) = 0$, hence the difference of these voltages being equal to zero will correspond to the absence of a static load on the motor shaft.

Figure 4:
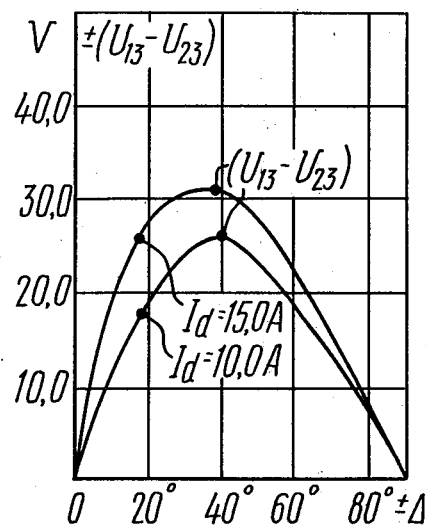
FIG. 4 is a graphic representation of the relationship $(U_{13} - U_{23}) = f(\Delta)$ (rated $I_d = 10$ A) of a synchronous reaction motor operating in braking duty.

Shown in FIG. 4, by way of example, are curves ($U_{13} - U_{23}$) indicative of the dependence of the voltage difference ($U_{13} - U_{23}$) on the angle $\Delta$ of the same synchronous reluctance motor, with $I_d = 10$ A and $I_d = 15$ A.

In the case where the neutral terminal of the motor stator is brought out of the motor in FIG. 1, the angle $\Delta$ can as well be determined from the relationships ($U_1 - U_2$) $= f(\Delta)$ and $U_3 = f(\Delta)$.

Figure 5:
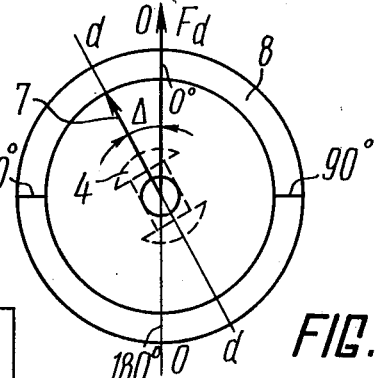
FIG. 5 shows diagrammatically the measurement of the displacement angle with the aid of an angle meter.

Thus, the displacement angle and the static load moment $M_s$ on the shaft of a synchronous reaction motor operating in braking duty under conditions when there is no access to the shaft can be determined in the following sequence:

a. initially, when the motor shaft is accessible, the relationships ($U_1 - U_2$) $= f(\Delta)$ or ($U_{13} - U_{23}$) $= f(\Delta)$ are determined, with the motor being energized, as shown in FIG. 1, with a pulsating current of a predetermined magnitude. For example, with the rated current, and the displacement angle $\Delta$ being measured with the aid of, for example, an angle meter including a pointer 7 associated with the motor shaft in FIG. 5 and a dial 8 graduated in degrees. At the same time, the load-angle characteristic curve of the motor is determined ($M_e = f(\Delta)$).

b. during the operation of the motor, which forms part of a drive and in energized with a pulsating current of the same magnitude as before, the voltages $U_1, U_2$ or $U_{13}, U_{23}$ are measured, the angle $\Delta$ is determined from the relationships ($U_1 - U_2$) $= f(\Delta)$ or ($U_{13} - U_{23}$) $= f(\Delta)$ which are already known, and the torque at the motor shaft is determined from the relationship $M_e = f(\Delta)$.

To facilitate measurement of the displacement angle, a special means should preferably be provided which would compare the voltages $U_{13}$ and $U_{23}$, for example, by way of subtracting one from the other;

($U_{13} - U_{23}$).

Figure 6:
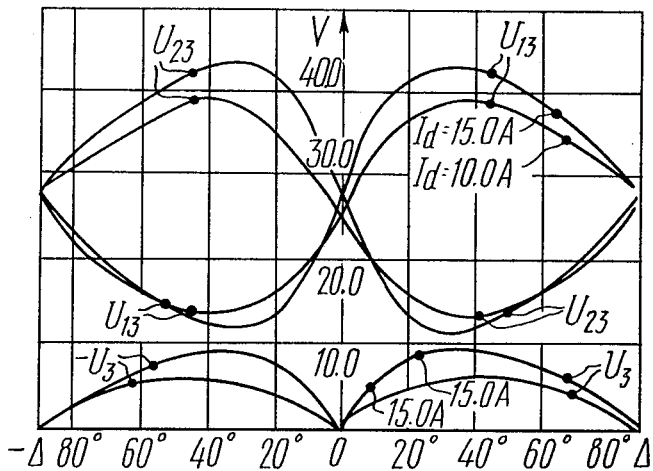
FIG. 6 is a functional diagram of a device for measuring the displacement angle of a synchronous reaction motor operating in braking duty.

FIG. 6 shows a functional diagram of a means for determining the displacement angle $\Delta$ from the line voltages $U_{13}$ and $U_{23}$ as well as the connection of this means to the phase windings of a motor.

The means comprises a voltage comparison unit 9 in FIG. 6, a measuring instrument 10, a measurement range changer 11, a protection unit 12, and a supply voltage direct component polarity indicator 13.

The line voltages $U_{13}$ and $U_{23}$ are applied to the input of the comparison unit 9. Applied from the output of the comparison unit 9 to the measuring instrument 10 is a signal proportional, for example, to the voltage difference ($U_{13} - U_{23}$) which corresponds to a definite displacement angle $\Delta$.

The unit 12 is intended for protection of the measuring instrument 10 and comparison unit 9 from current surges. The measurement range changer 11 permits the single scale of the measuring instrument 10 to be used with different preset magnitudes of the pulsating current. The polarity indicator 13 is used to ensure correct connection of the means to the terminals of the motor.

Figure 7:
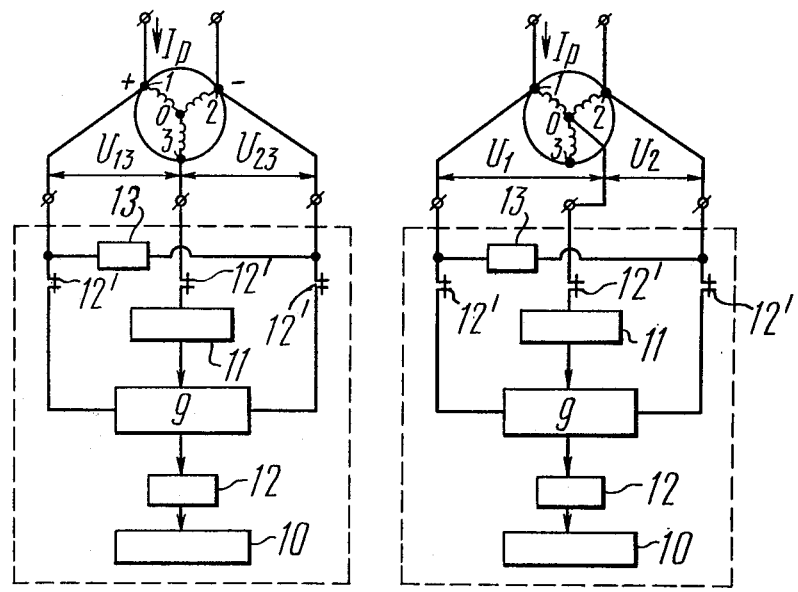
FIG. 7 is a functional diagram of a device for measuring the displacement angle of a synchronous reaction motor having the neutral terminal of its stator winding brought out therefrom and operating in braking duty.

In the case of the neutral terminal of the stator of the motor being brought out therefrom as shown in FIGS. 1 and 7, also applied to the input of the comparison unit 9 may be the phase voltages $U_1$ and $U_2$ in FIG. 7 of the working phase windings 1 and 2.

The measuring instrument 10 is graduated during the period when the motor shaft is accessible, the windings 1 and 2 of the motor as shown in FIGS. 1, 6 and 7 being energized with a pulsating current of a preset magnitude, for example, with the rated current; the instrument 10 may be graduated both in the units of the displacement angle $\Delta$ and in those of the load on the motor shaft.

When the motor is used as part of a drive, to measure the displacement angle or the load on its shaft the input of the comparison unit 9 of the means for determining the displacement angle is connected to the windings 1, 2, 3 FIG. 6 or 1, 2, 0 FIG. 7 and, the magnitude of the pulsating current remaining the same, the angle $\Delta$ or load on the motor shaft is determined by means of the measuring instrument 10.

As has been mentioned above, the proposed method and means may also be used for quality control in the manufacture of electric machine rotors.

It is well known for example, that the relationship ($U_{13} - U_{23}$) $= f(\Delta)$ is practically the same for a specific batch of synchronous reaction motors. When this relationship in one or more motors differs sharply from that in the already accepted motors of the same batch, this is indicative of the parameters of their rotors deviating from the rating.

In a similar manner, the relationship ($U_{13} - U_{23}$) $= f(\Delta)$ can be used for determining the quality of other types of electric machines, whose rotors are characterized by magnetic or electric asymmetry.

In the case of electric machines with magnetically or electrically symmetric rotors, for example, squirrel-cage motors, the voltages $U_{13}$ and $U_{23}$ must be equal within the entire range of variation of the angle $\Delta$. If with certain values of the angle these voltages are not the same, this is indicative of the rotor being magnetically or electrically asymmetric, which may also be regarded as a production fault.

To facilitate determination of the relationship ($U_{13} - U_{23}$) $= f(\Delta)$ in the electric machines under investigation, use should preferably be made of a means for determining the displacement angle with the scale of its measuring instrument being graduated within the range permissible for a particular batch of machines.

The proposed method of checking the quality of rotors being manufactured necessitates no special testing equipment and is time-saving, and the means for effecting this method is simple and reliable.

What is claimed is:

1. A method of determining the displacement angle of a synchronous reluctance motor operating in braking duty, with a three-phase star-connected stator winding arrangement with two series-connected working phase windings and a free third phase winding, said motor being generally used as an actuating motor in the drive of control and protection systems of nuclear power reactors, comprising the steps of:

passing a pulsating current of a predetermined magnitude through said stator working phase windings to determine the relationships between the displacement angle and phase voltages and line voltages across said stator windings:

measuring the phase voltages and line voltages across the stator windings during the operation of the motor, while maintaining said predetermined magnitude of the current through said working phase windings; whereby the required displacement angle is determined from said relationships.

2. The method as of claim 1, which further comprises: measuring two line voltages between the free phase winding and each working phase winding; determining the displacement angle from the relationship established between this angle and said line voltages.

3. The method as of claim 1, wherein, said motor includes a neutral terminal of the stator winding arrangement being brought out of the motor; measuring the phase voltages across the working phase windings; determining the displacement angle from the relationship established between this angle and said phase voltages.

4. A device for determining the displacement angle of a synchronous reluctance motor operating in braking duty, with a three-phase star-connected stator winding arrangement with two series-connected working phase windings and a free third phase winding, said motor being generally used as an actuating motor in the drive of control and protection systems of nuclear power reactors, comprising: a voltage comparison unit having its input connected to the working phase windings energized with a pulsating current; a measurement range changer inserted between said input of said voltage comparison unit and said free phase winding; and an indicating instrument connected to the output of said voltage comparison unit and having its scale graduated in degrees during the initial period when the motor shaft is accessible.

5. A device as of claim 4, wherein, said motor has the neutral terminal of its stator winding arrangement brought out thereof; a connection between said neutral terminal via said measurement range changer to said voltage comparison unit.

* * * * *